United States Patent [19]
Linz

[11] Patent Number: 6,005,901
[45] Date of Patent: Dec. 21, 1999

[54] ARRANGEMENT FOR ASYNCHRONOUS DECIMATION USING A FREQUENCY RATIO ESTIMATOR AND METHOD THEREOF

[75] Inventor: Alfredo R. Linz, Austin, Tex.

[73] Assignee: Advanced Micro Devices, Austin, Tex.

[21] Appl. No.: 08/807,836

[22] Filed: Feb. 27, 1997

[51] Int. Cl.[6] .............................. H04L 7/00; H03M 7/00; H03M 1/00
[52] U.S. Cl. ......................... 375/355; 375/371; 375/372; 341/50; 341/61; 341/123; 370/503; 370/516
[58] Field of Search ...................................... 375/355, 372, 375/371; 341/61, 123, 50; 370/516, 503

[56] References Cited

U.S. PATENT DOCUMENTS

| | | | |
|---|---|---|---|
| 3,754,098 | 8/1973 | Abramson et al. ...................... | 375/371 |
| 4,564,918 | 1/1986 | McNally et al. . | |
| 4,748,578 | 5/1988 | Lagadec et al. . | |
| 4,780,892 | 10/1988 | Lagadec . | |
| 4,825,398 | 4/1989 | Koch et al. . | |
| 5,119,093 | 6/1992 | Vogt et al. ............................... | 341/123 |
| 5,313,205 | 5/1994 | Wilson .................................... | 341/144 |
| 5,365,468 | 11/1994 | Kakubo et al. ....................... | 364/724.1 |
| 5,398,029 | 3/1995 | Toyama et al. ............................ | 341/61 |
| 5,457,456 | 10/1995 | Norsworthy .............................. | 341/61 |
| 5,471,411 | 11/1995 | Adams et al. . | |
| 5,475,628 | 12/1995 | Adams et al. . | |
| 5,481,267 | 1/1996 | Miyabe et al. ............................ | 341/61 |
| 5,481,563 | 1/1996 | Hamre ..................................... | 375/226 |
| 5,512,895 | 4/1996 | Madden et al. ........................... | 341/61 |
| 5,559,513 | 9/1996 | Rothermel et al. ........................ | 341/61 |
| 5,617,088 | 4/1997 | Yasuda ..................................... | 341/61 |
| 5,640,388 | 6/1997 | Woodhead et al. ..................... | 370/468 |
| 5,666,299 | 9/1997 | Adams et al. .................... | 364/724.011 |

OTHER PUBLICATIONS

Adams, R., et al., "A Stereo Asynchronous Digital Sample–Rate Converter for Digital Audio", *IEEE Journal of Solid–State Circuits*, 29(4):481–488 (Apr. 1994).

*Primary Examiner*—Stephen Chin
*Assistant Examiner*—Michael W. Maddox
*Attorney, Agent, or Firm*—Merchant & Gould P.C.

[57] ABSTRACT

A communication system includes a data sampling rate converter that uses a closed-loop control arrangement to convert an input signal at a first sampling rate to a second, asynchronous, sampling rate without requiring extensive output buffering. A small number of data registers in a first-in-first-out output buffer is used to receive and store computed data samples at a controlled rate and to pass these data samples to the output at a second rate. The output buffer indicates, the current capacity of the output buffer for use by a frequency ratio estimator, which is arranged to respond by providing an estimate of the actual ratio between the first rate and the second rate. A controller responds to the frequency ratio estimator by generating the controlled rate at which the computed data samples are to be passed to the output buffer. In this manner, the processed data samples are passed to the output buffer at the controlled rate and are output at the second rate. The processed data use the input samples received at a first rate and the ratio value.

30 Claims, 5 Drawing Sheets

LOW − PASS FILTER $y(n) = y(n-1) + (1-a)[s(n) - y(n-1)]$
$Y(z) = (1-a)/(1-az^{-1})$

ARRANGEMENT FOR ASYNCHRONOUS DECIMATION USING A FREQUENCY RATIO ESTIMATOR AND METHOD THEREOF

FIELD OF THE INVENTION

The present invention relates generally to digital control arrangements. More particularly, the present invention relates to digital control arrangements used in connection with sampling rate conversion systems having an input signal of one sampling frequency converted to an output signal of another sampling frequency.

BACKGROUND OF THE INVENTION

In many communication systems, digital signals are presented to communication equipment using one communication protocol and are then generated from the equipment using another communication protocol. For a number of applications in communication environments of this type, the communication protocols involve converting an input stream of the digital signals arriving at a first sampling data rate and permitting another equipment type to receive the signals at a second data sampling rate. Where these data rates are not equal, as in asynchronous data transfer schemes, maintaining accurate communication can be difficult.

The degree of difficulty typically depends on the type of system being used. Typical systems are designed with the expectations that the input and output sampling rates will have known nominal values and that the actual values will not depart significantly from the nominal values. The actual values, however, depend upon the characteristics of various circuits, such as crystal oscillators, which have a range of tolerances. These tolerances cause the actual values of the sampling rates to change over time. Depending on the application and the degree of signal integrity required, these changes can be highly problematic.

Consider, for example, a conventional sampling rate conversion system in which the converter operation is designed according to the known nominal values of the input and output sampling rates. Should the ratio of the input and output sampling rates significantly change from the nominal or expected value, the quality and efficiency of the communication can be severely degraded. For example, if the input sampling rate fs1 is higher than its nominal value, samples will arrive more often than they are processed by the sampling rate conversion system. This discrepancy will typically result in the sampling rate conversion system losing or failing to process some of the input samples.

One previously known technique for addressing this problem involves using a large buffer. A buffer of this type receives input samples at a rate fs1 defined by an input clock. The sampling rate conversion system processes the readily available data input samples stored in the buffer at an output sampling rate fs2. Where the output sampling rate is appreciably less than the rate at which input data are processed, the large buffer is used as an overflow for processed input samples so as to permit output processing at a lower sampling rate. While large buffers mitigate these problems, such buffers are costly and do not eliminate the problems.

Known sampling rate conversion systems also deal with a problem sometimes referred to as frequency offset. Frequency offset is evidenced when the reproduced signal at the output has a frequency that is different from the specified frequency. Frequency offset is a common problem that has been addressed in a variety of ways depending on the design of the sampling rate conversion system. Many of these designs require labor-intensive recalibration of the circuits. Other such designs require retransmission of the data whenever the frequency offset exceeds a certain specified threshold.

SUMMARY OF THE INVENTION

According to one aspect of the present invention, a system converts an input signal received at a first rate according to a first clock signal to an output signal generated at a second rate according to a second clock signal which is lower than the first. For such an application, the present invention provides a data sampling conversion arrangement including: an output buffer circuit having a set of data storage registers arranged to pass processed data samples at a variable rate; a current capacity signal generated by the output buffer circuit and indicative of current use of the set of data storage registers; a ratio estimation circuit arranged to respond to the current capacity signal and providing an estimate of the actual ratio between the first rate and the second rate; and a control circuit responsive to at least one of the first and second clock signals and to the ratio estimation circuit and arranged to control the variable rate at which the data storage registers receive the processed data samples.

Another aspect of the present invention is directed to a method for converting an input signal received at a first rate to an output signal generated at a second rate. The method comprises: using a set of data storage registers as an output buffer for receiving processed data samples for storage at a controlled rate and for passing these data samples as outputs at a second rate; providing a quantity signal to indicate the quantity of the data samples that are currently stored in the set of data storage registers; in response to the quantity signal, estimating the actual ratio between the first rate and the second rate; and, in response to estimating the actual ratio, generating the controlled rate at which the data samples are to be stored into the set of data registers and outputting the data samples at the second rate.

Another aspect of the present invention is directed to a communication system incorporating one of the various versions of the above-summarized embodiments.

The above summary of the present invention is not intended to describe each disclosed embodiment of the present invention. This is the purpose of the figures and of the detailed description that follows.

BRIEF DESCRIPTION OF THE DRAWINGS

Other aspects and advantages of the invention will become apparent upon reading the following detailed description and upon reference to the drawings in which.

DETAILED DESCRIPTION OF THE DISCLOSED EMBODIMENTS

Figure 1:
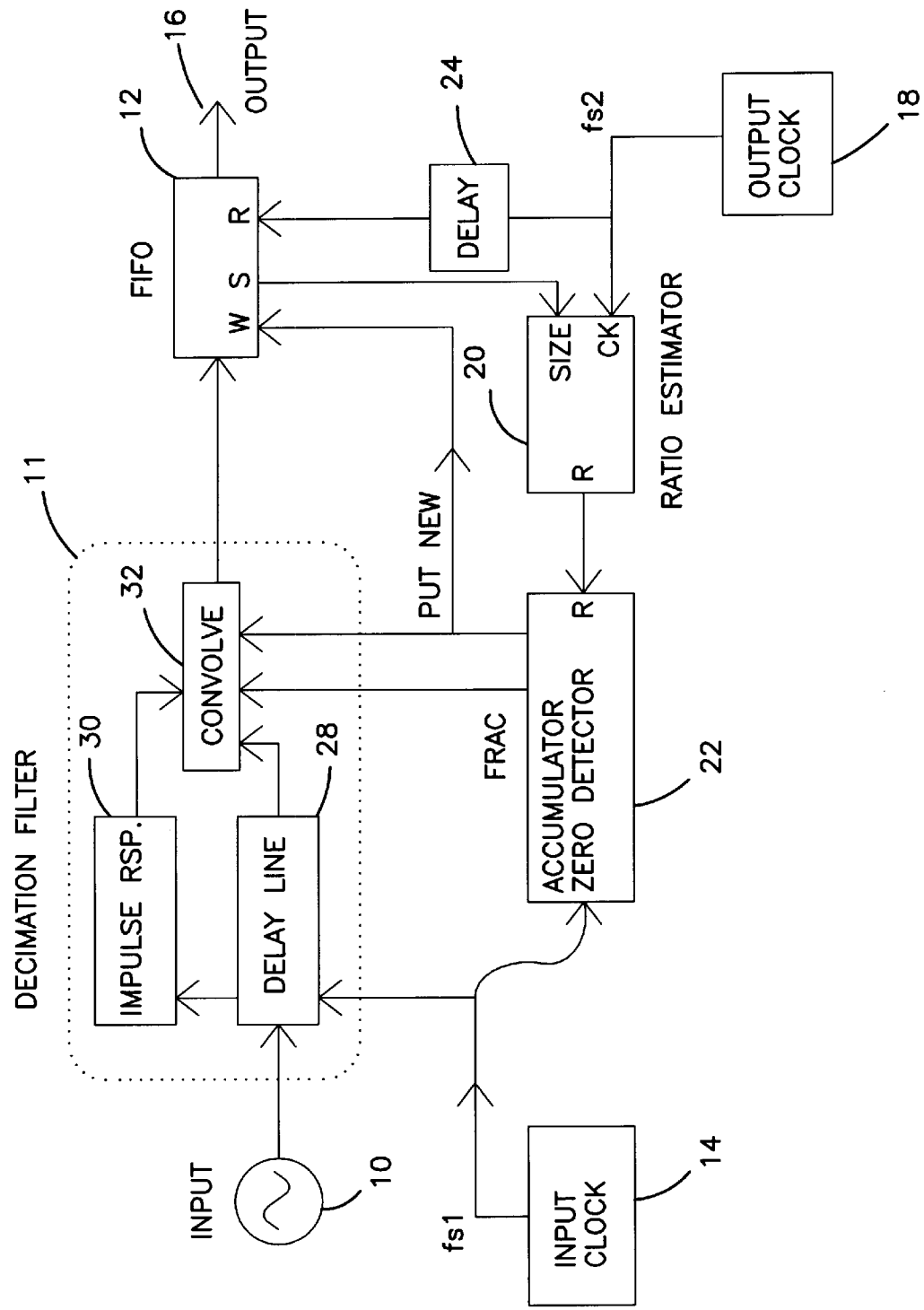
FIG. 1 is a block diagram illustrating a specific embodiment of the present invention.

While the invention is susceptible to various modifications and alternative forms, specific embodiments thereof have been shown by way of example in the drawings and will herein be described in detail. It should be understood, however, that the detailed description is not intended to limit the invention to the particular forms disclosed. On the contrary, the intention is to cover all modifications, equivalents, and alternatives falling within the spirit and scope of the invention as defined by the appended claims.

The present invention is generally applicable to a variety of data signal processing environments. The present invention has been found to be particularly advantageous for sampling rate conversion applications, such as synthesizers and codecs, in which the input and output sampling rates differ from one another so as to require decimation (either alone or with interpolation) and in which the ratio of the output sampling rate to the input sampling rate tends to fluctuate or is not known exactly. In accordance with the present invention, a specific implementation of a sampling rate conversion system addressing this type of environment is illustrated in FIG. 1.

The system of FIG. 1 includes a data input source 10 that provides data to a decimation filter 11, which processes the received data before passing the data along to an output buffer 12. The decimation filter 11 includes a delay line 28 that samples the input data at a sampling rate fs1 as determined by an input clock signal FS1 provided by an input clock circuit 14. In the specific implementation illustrated in FIG. 1, the decimation filter 11 includes an impulse response circuit 30 and a convolution circuit 32, which operate with the delay line 28 to provide a finite impulse response (FIR) low pass filtering function. The system processes the data to develop an output stream of data at an output port 16, with the output data provided at a sampling rate fs2 corresponding to transitions of an output clock signal FS2 provided by an output clock circuit 18.

The ratio R of the input sampling rate fs1 to the output sampling rate fs2 plays an important role in the system of FIG. 1. While the nominal input and output sampling rates for many conversion applications are generally known, the actual sampling rates at any given time tend to vary and tend to depend on various factors that can be difficult to control. Departure of the ratio of the output sampling rate to the input sampling rate, fs2/fs1, from the expected or nominal ratio can produce unacceptable effects. These effects include losing processed samples, for example, if the samples are output slower than they are processed by the system, and having to reuse previously stored samples, for instance, when processed samples arrive less frequently than expected.

Using a closed-loop, error-correcting arrangement, the system of FIG. 1 overcomes these problems. To track departures from the expected ratio, a ratio estimator 20 provides an ongoing recent estimate of the actual ratio. This determination of the actual ratio value is used to adjust automatically the rate at which samples are passed through the output buffer 12 of FIG. 1. This adjustment allows for a relatively small buffer, e.g., having only three registers, to be used with little, if any, risk of losing or having to reuse input samples if the actual ratio departs from the expected nominal value. As described in further detail below, the system of FIG. 1 provides fast correction, thereby quickly tracking and overcoming even slight variations in the sampling rates. Data sampling can thus be precisely controlled to ensure that the output buffer 12 will be neither over-utilized nor under-utilized.

The ratio estimator 20 accounts for this automatic R value correction and responds to the output sampling clock signal and to a signal that indicates the capacity of the output buffer 12 to receive additional samples. This current capacity indication can be provided in a number of ways, including, for example, a multiple-bit indication in encoded or unencoded form that identifies the number of data samples occupying data registers in the output buffer or the number of output buffer registers that are not currently storing data samples.

Various commercially available first-in-first-out (FIFO) memories of this type provide such a capacity indication by using a recent count of an increment/decrement counter, which increments each time a data sample is written to the memory and decrements each time a data sample is read from the memory. For applications in which there is insufficient real estate for a large FIFO memory, a commercially available FIFO memory having no more than about four data registers can be used with the capacity indication being provided via unencoded multi-bit form.

With the ratio estimator 20 initially set to a nominal ratio, the current output buffer capacity and output sampling rate are used to provide an accurate representation of the ratio as recent as the last transition in the output clock signal. In the specific example illustrated in FIG. 1, the value of the ratio provided by the ratio estimator 20 is used as one of two inputs to an accumulator/decrement detector ("detector") 22. The other input to the detector 22 is the input sampling rate fs1 provided by the input clock 14. The detector 22 uses the most recent estimate of the ratio R and the input sampling rate to control the generation of samples at the input end of the output buffer 12.

Consider, for example, a size value increase indicating that the rate at which the output buffer 12 is being filled has increased with respect to the output sampling rate fs2. To prevent the output buffer 12 from filling too close to full capacity, the ratio estimator 20 adjusts the ratio R in such a way that the frequency of write operations into the output buffer 12 decreases. Read instructions to the output buffer 12 occur in response to clocked transitions provided at the clock input to the detector 22 synchronized to the input clock FS1.

In an alternative embodiment, the current actual ratio between the input sampling rate and the output sampling rate is obtained using the capacity indication from an input buffer and the input sampling rate as inputs to the ratio estimator 20, with the detector 22 being designed to respond to the output sampling rate rather than the input sampling rate. For a more detail on this alternative approach, reference may be made to co-pending U.S. Patent Application entitled FREQUENCY RATIO ESTIMATION ARRANGEMENT AND METHOD THEREOF (U.S. patent application Ser. No. 08/810,338, filed concurrently herewith and incorporated herein by reference.

For particular applications benefiting from steady-state operations at all times, a delay circuit 24 is used at startup to permit the output buffer 12 to fill up to a nominal level, for example, three registers, before the clock 18 is permitted to cause a read from the output buffer 12. Once the output buffer 12 is at the nominal level, the most recent estimate of the ratio R is used by the detector 22 to process data samples into the output buffer 12 and to maintain the capacity of the output buffer 12 close to the nominal level.

The fractional output (FRAC) from the detector 22 is used to obtain the filter coefficients to be used in the computation of an output sample for the corresponding period of the output clock signal fs2. In one implementation, this is done by sampling a certain continuous impulse response at some start time fraction of T1 and at each interval of T1 thereafter up to N·T1·D/U=NT2, which is the duration of the impulses response. In this context, R is the ratio, fs1/fs2, T1 is the period of the original input data, ND/U is the size of the decimation filter 11, T2 is the period of the output data, D is the decimation factor and U is the interpolation factor, with D>U. For this example implementation of FIG. 1, the size of the decimation filter 11 is also the size of the delay line 28. The delay line 28, which may be implemented using any of several commercially available devices or in integrated form, stores ND/U data samples output from the input data source 10.

In the implementation of FIG. 1, the detector 22 is initially set to zero. At each transition of the input clock signal FS1, the ratio R is added to the detector 22, and a new sample is brought into the delay line 28 of the decimation filter 11. If the detector 22 detects that the integer part of the accumulated number in the detector 22 is zero, an output sample is computed, using the fractional part to obtain the filter coefficients for processing within the decimation filter 11. If the integer part is not zero, the accumulated number in the detector 22 is decremented. So long as the accumulated number does not transition to zero, the filter does not compute or generate an output sample.

The detector 22 permits data to be transferred from the filter 11 in response to the integer value being detected as having reached zero. As soon as the integer part of the accumulator reaches zero, a new data sample is taken from the filter 11 and shifted into the output buffer 12. To accommodate this aspect of the conversion system of FIG. 1, the circuit depicted as element 22 of FIG. 1 includes an accumulator circuit, a decrementing circuit, and a zero detector which indicates when the integer part of the accumulator has transitioned to zero.

With the detector 22 selectively writing data samples from the filter 11 into the output buffer 12, the input data from the input data source 10 are processed according to the construction of the filter 11, as required for the particular application design, and are passed via the output port 16 at the controlled output sampling rate fs2.

Equilibrium within the output buffer 12 is achieved when the output buffer 12 includes the same average number of samples per unit time being received via write commands and being sent out via read commands. Theoretically, if R has an exact value rather than an estimate as updated in the last cycle, in an interval of time equal to M·T1 with M being large, the accumulator is decremented to zero M/R times. With the filter generating an output sample in response to each occurrence of the accumulator reaching zero, the filter generates (M/R)/(M·T1) results per unit time. With the output clock 18 controlling the output sampling rate as fs2, 1/T2=fs2 results per unit time are written into the output buffer (where T2 equals the period of the output clock), and the number of samples per unit time read from the output buffer is also fs2. Where R is less than T2/T1, the number of results generated per unit time is greater than fs2, and the output buffer increases above the desired equilibrium level. Conversely, where R is greater than T2/T1, the output buffer decreases below the desired equilibrium level.

According to the present invention, the embodiment of FIG. 1 overcomes the problem that arises when the output buffer 12 begins to fill up or when it begins to empty. The arrangement of FIG. 1 uses the output buffer size as a control variable and adjusts R so that the size remains constant at some desired value. The arrangement illustrated in FIG. 1 does not change the actual clock frequencies. Instead, it changes the particular input clock instance at which the output buffer size is increased by changing R in such a way that the rate of accumulation is equal to the rate of consumption. The ratio estimator 20 operates in synchronism with fs2, allowing computations to proceed at the lower of these two rates.

The decimation filter 11 can be implemented using discrete hardware, integrated circuits, or any of several commercially-available digital signal processor circuit arrangements programmed to process data samples passed from the output buffer 12 using coefficients as determined for the specific filtering application. Where a digital signal processor circuit arrangement is used to implement the decimation filter 11, the operations of the ratio estimator 20 and the detector 22 can also be programmed into the same or a different digital signal processor chip. The benefits of implementing processing of this type as programmed digital signal processor circuits or as discrete or integrated hardware circuits typically depend on the application at hand.

For more information concerning a hardware or software implementation for this type of digital processing circuitry, or specifics concerning the illustrated filter or alternative types of digital filters, reference may be made to "Digital Signal Processing," Emmanuel C. Ifeachor and Barrie W. Jervis, Addison-Wesley, 1993 (e.g., ch. 5 and ch. 6), incorporated herein by reference.

In general, conversion by U/D corresponds to an interpolation process in which an up conversion by a factor of U is followed by a down conversion by a factor of D, with the up conversion corresponding to stuffing U−1 zeros into the data stream between data samples followed by filtering the resulting signal to eliminate images above 1/2×fs1. Decimation consists of filtering to eliminate frequency components above 1/2 the final sampling rate (U·fs1)/D, followed by down sampling by D by discarding D−1 samples out of every D samples.

If U is greater than D, the filtering function associated with the interpolation has a cutoff frequency lower than the filter associated with the decimator (fs1/2<fs1/2×U/D) and, therefore, is the dominant function. The length of the filter's impulse response is a constant number of input periods. For an example of this operation, reference may be made to the above-referenced co-pending application entitled FREQUENCY RATIO ESTIMATION ARRANGEMENT AND METHOD. When D is greater than U, the filtering function associated with the decimation has a cut-off frequency lower than the filter associated with interpolation and is the dominant function. The length of the filter's impulse response is a constant number of output periods.

Figure 2:
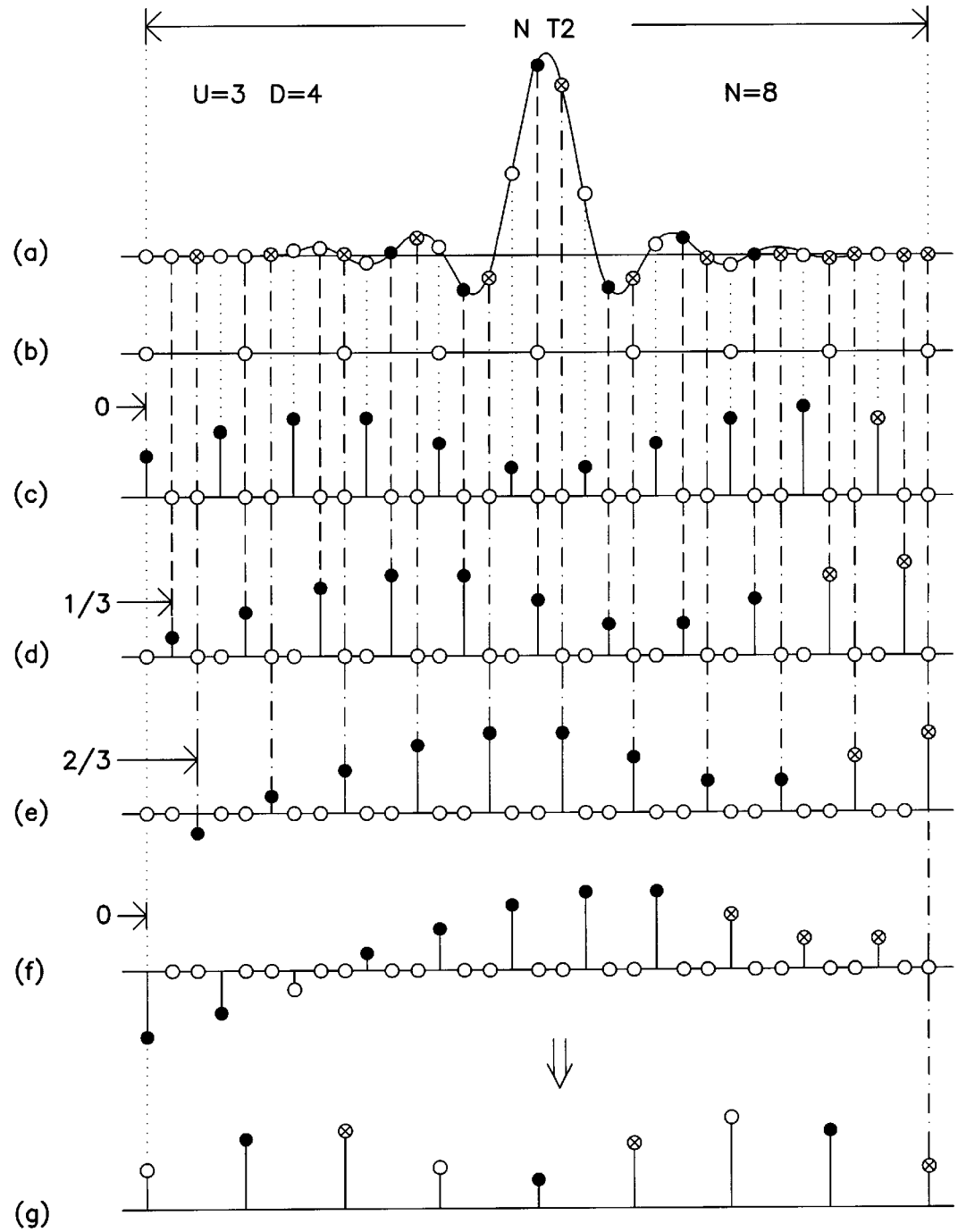
FIG. 2 comprises a series of timing diagrams, (a)–(g), that conceptually illustrates another interpolation/decimation implementation of the present invention for a different set of conditions.

FIG. 2 illustrates the operation of the arrangement of FIG. 1 for the example in which U=3 and D=4. For this example, the cutoff frequency for the decimation filter (11 of FIG. 1) is nominally at 1/2 fs1*U/D. Where the filter duration for the previous example was N·T1, for this example the filter duration is stretched by a factor of D/U to N/(fs1(D/U))= N/fs2=N·T2 in order to compress its frequency response, consistent with the Fourier transform relationships. After this example, the decimation function of the filter dominates, and the interpolation filtering function is irrelevant. Assuming that the filter 11 is constructed as an FIR type, the intermediate results do not have to be computed. Thus, when an output is not needed, the input signal in the delay line is merely shifted without computation.

The impulse response depicted as diagram (a) in FIG. 2 corresponds to the example application in which U=3 and D=4. Diagram (b) of FIG. 2 shows the output sampling rate fs2 being used to compute output samples used by the decimation filter. In diagram (c), the input data points are shown for the first computation. These data points are convolved with input samples obtained from the impulse response with an offset of zero (phase 0) and spaced by T1 from each other (as indicated by the white circles in FIG. 2). The number of input data points included in the filter's impulse response duration is greater than N by approximately D/U (in this instance, 4/3). The next three interpolated outputs are discarded, so the signal is merely shifted three times, as shown in diagram (d) of FIG. 2. The next output is calculated when the signal has been shifted again, and this time it is filtered with values obtained from the impulse response with an initial offset of 1/3 (phase 1, corresponding to the solid or grey circles). This is illustrated in timing diagram (d) of FIG. 2, with the samples shifted four times as shown by the darkened circle at the second position from the left. The next computation occurs when the sampled signal has, again, been shifted by four clocks, which results in a new sample being admitted and an initial offset of 2/3 into the impulse response, as shown in diagram (e) of FIG. 2. The 2/3 offset corresponds to filter coefficients for phase 2 (cross-hatched circles). The next value is computed with an offset of zero after two new samples have been shifted in, as shown in diagram (f) of FIG. 2, which is four clock shifts to the right of that shown in diagram (e).

In this example of FIG. 2, eleven samples are used in the filter for each computation. The number of samples used by the filter is determined by the following formula:

$$INT(N \cdot D/U - p) + 1$$

where p is the initial offset and "INT( )" denotes "integer part of". The output signal (diagram (g) of FIG. 2) has samples spaced by T2=4/3 T1.

Figure 3:
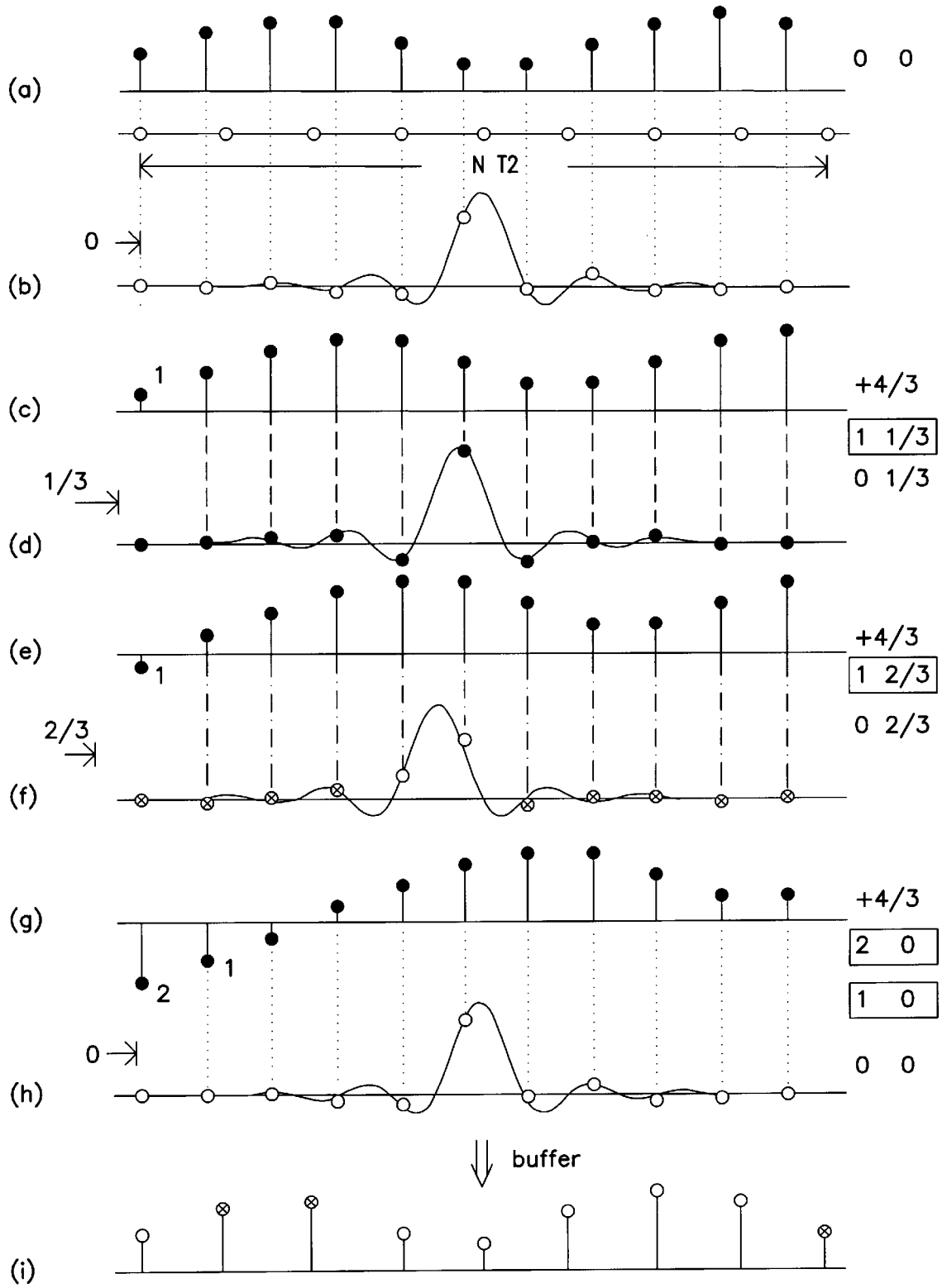
FIG. 3 comprises a series of timing diagrams, (a)–(i), that conceptually illustrates an interpolation/decimation implementation of the present invention for the set of conditions of FIG. 2 but with reference to the input data.

FIG. 3 illustrates the same process and conditions as shown in connection with FIG. 2, but using the input data (diagram (a) of FIG. 3) as a reference rather than the impulse response that was used in connection with FIG. 2. On the right side of FIG. 3, there is illustrated the accumulator portion of the detector 22 of FIG. 1. The accumulator, which has an integer part and a fractional part, is initially set to zero. The fractional part gives the offset into the impulse response curve and, therefore, is used to select the phase and the subset of filter coefficients.

The first computation is performed as before with FIG. 2, using an initial offset of zero for phase 0, as shown in diagram (b) of FIG. 3. At this point, R=4/3 is added to the accumulator, which reflects the ratio estimate at the last FS1 clock transition, as shown in diagram (c) of FIG. 3. In the next cycle, because the integer part of the accumulator is not equal to zero, the accumulator is decremented and a new sample is shifted into the delay line without computing an output sample. In the next cycle (diagram (d) of FIG. 3), a calculation is made using the new data in the delay line and using the fractional part of the accumulator. With reference to diagram (e) of FIG. 3, the accumulator is again incremented by 4/3 to yield 5/3. In the next cycle, the integer part of the accumulator is not detected as being equal to zero, so it is decremented and a new sample is shifted into the delay line.

In the next cycle (diagram (f) of FIG. 3), the integer part of the accumulator is detected as being equal to zero. Consequently, the filter computes an output with an offset of 2/3 (phase 2). With reference to diagram (g) of FIG. 3, a value of 4/3 is added to the accumulator again to yield an integer part of two and a fractional part of zero. In the next cycle of FS1, the accumulator is decremented to yield an integer part of one and a fractional part of zero. In the next cycle of FS1, the accumulator is again decremented, this time to yield an integer part of zero and a fractional part of zero. Finally, in the next cycle (diagram (h) of FIG. 3), the filter computes a new output with an offset of zero (phase 0), and the process continues. The output signal is shown in diagram (i) of FIG. 3.

Accordingly, whenever the integer part is nonzero, it is decremented and a new sample is retrieved. The filter computes an output when the integer part is zero. In this manner, the computations by the filters are synchronized to the input clock signal FS1, but occur only sometimes, while the output values are synchronized to the output clock signal FS2.

Figure 4:
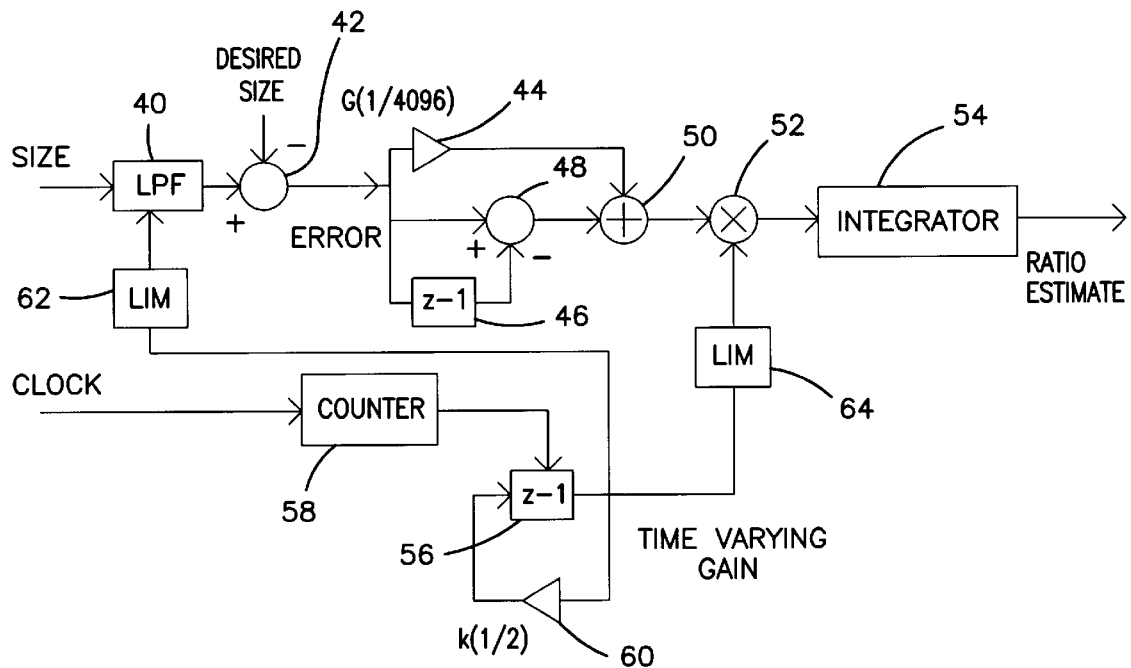
FIG. 4 is an exploded view of the ratio estimator arrangement depicted in FIG. 1.

Referring now to FIG. 4, a specific implementation of the ratio estimator 20 of FIG. 1 is shown in exploded block form. This ratio estimator is constructed using discrete integrated circuitry or using a programmed digital signal processor. The ratio estimator 20 includes a recursive low-phase filter (LPF) 40, which is used to provide a smoothed estimate of the size of the output buffer, depicted as "FIFO" in the figures. By its very nature, the FIFO size input to the LPF 40 is incremented or decremented by a coarse value of plus or minus one. The long term average output from the LPF 40 is compared to a desired FIFO steady-state size via a subtractor circuit 42 to generate an error signal at the output: of the LPF 40. This error signal indicates the difference between the actual size and the pre-selected desired size of the FIFO.

Additional circuitry develops the error signal into proportional and derivative components and applies the error signal to an integrator to form the new estimate of R. The proportional component, which is provided by a scaling circuit 44, e.g., scaling down by a factor of $2^{12}$, allows the input signal to be adjusted to the desired value, and any steady-state deviation from this value results in a change of the correct polarity being applied to R.

The derivative component, which is provided by a storage register 46 and a subtractor circuit 48, speeds up the convergence by indicating the rate of change of the error. The storage register 46 stores the previous value of the error generated by the subtractor circuit 42 after the last transition in the FS2 clock signal. The subtractor circuit 48 subtracts this previous value from the current value of the error and gives a first-difference approximation to the derivative. If the size is changing rapidly in one direction, e.g., increasing, then a positive correction proportional to the rate of change is applied to R. This has the effect of making the write operations less frequent, reducing the buffer size. The proportional and derivative components are then combined at a summing circuit 50 and mixed at a multiplier circuit 52, with the output of the third main section, before the processed output signal is integrated by an integrator 54. Because the integrator 54 acts on a proportional and a derivative component, the resultant estimate is modified by an integral component and a proportional component, effectively acting as a type of proportional integral controller.

Another section of the ratio estimator 20 provides time-varying gain, which affects both the gain of the error signal applied to the integrator 54 and the time constant of the low-pass filter 40. This variable gain is provided using a time-varying gain circuit or register 56, which responds to a cycle-count signal and a scaling constant. The cycle-count signal is provided by a counter 58 which counts fs2 cycles. The scaled signal is provided by a scaling circuit 60 which reduces the gain by a factor k (for example, 1/2) every M samples. Each time the counter 58 reaches its programmed threshold of M samples, e.g., 1024 cycles or counts, the counter 58 loads the time-varying gain circuit 56 with the previous gain scaled by the factor k. This provides a rapid first adjustment, for example, an initial gain of 1/32, after which the response of the loop is slowed down to allow only small modifications to the estimate. Limiters 62 and 64 prevent the gain from becoming smaller than certain minimum values which, in general, are different for the LPF 40 and for the integrator 54. For example, in a particular embodiment, the minimum value for the input to the LPF 40 is 1/512, and the minimum value for the input to the integrator 54 is 1/4096.

Several parameters can be adjusted as appropriate for the specified application. These adjustable parameters include, for example, the initial gain value provided by the gain circuit 56, the factor k by which the initial gain value is reduced, the interval between gain changes via the counter 58, and the final (limit) gain values. The desired size of the output buffer, and the gain of the integral error component can also be adjusted.

The ratio estimator is clocked at the output sampling rate fs2, which allows the processing to be done at the slower rate. Accordingly, the buffer size is observed by the low-pass filter only when it is read, so the actual size can be higher by one, because data can be written into the buffer in between output clocks.

Figure 5:
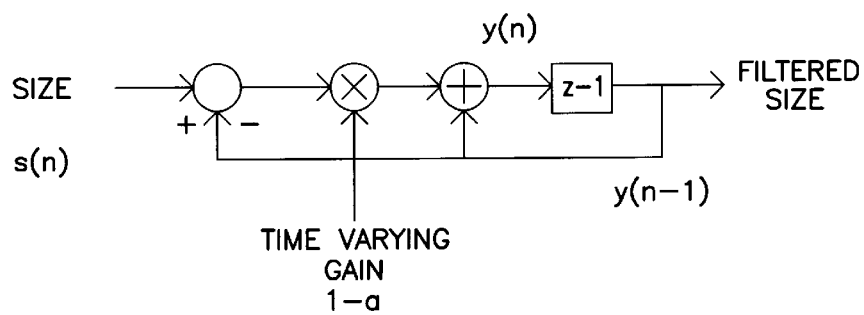
FIG. 5 is an exploded view of the low-pass filter arrangement depicted in FIG. 4.

The LPF 40 of FIG. 4 is shown in exploded block diagram form in FIG. 5. As with the block diagram for the ratio estimator, this block diagram for the LPF 40 provides a guide for programming a digital signal processor. The LPF 40 obeys the general time-domain equation:

$$y(n)=(1-a)*x(n)+a*y(n-1),$$

and has the general transfer function:

$$H(z)=Y(z)/X(z)=(1-a)/(1-az^{-1}).$$

For the specific implementation illustrated in connection with FIGS. 4 and 5, the LPF 40 provides an output y(n) as follows:

$$y(n)=y(n-1)+(1-a)[s(n)-y(n-1)],$$

where s(n) is the output buffer size as observed by the LPF 40 when it is read, and (1−a) is other input to the LPF 40 which is used to set its time constant.

Figure 6:
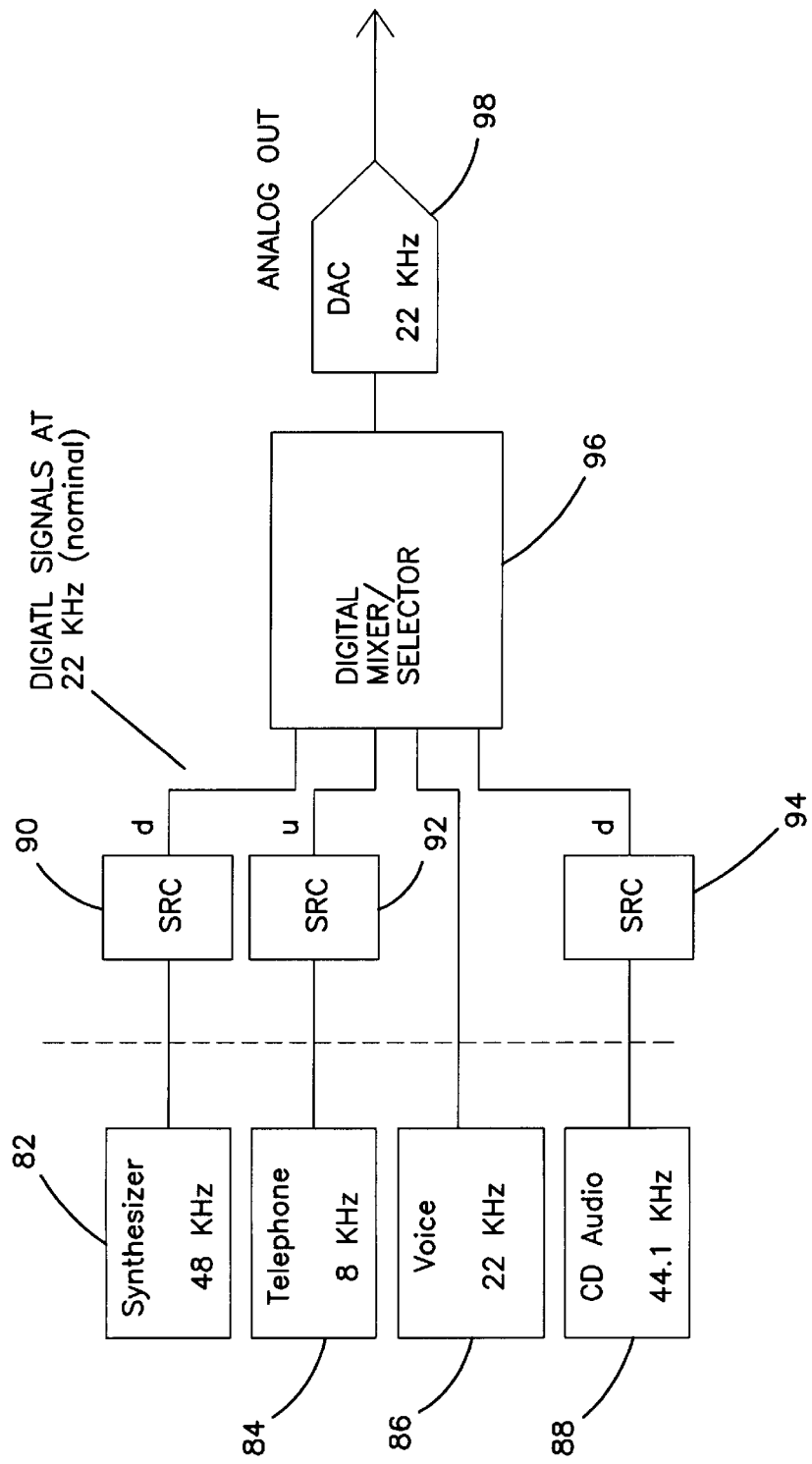
FIG. 6 is an illustration of an example application, according to a system implementation of the present invention.

Referring now to FIG. 6, an example application of the present invention is illustrated. In this specific system of FIG. 6, four different types of signal generators are shown as providing four different types of input signals. The first input signal is generated by a synthesizer 82 at a rate of 48 KHz. The three remaining signal generators include a telephone circuit 84 producing a digital signal at a rate of 8 KHz, a voice annotation circuit 86 carrying a voice signal at a sampling frequency of 22 KHz, and a compact disc audio generator 88 carrying audio signal at a rate of 44.1 KHz.

Each of the signal generators 82, 84 and 88 is processed by a sampling rate converting circuit (SRC), according to the embodiment of the present invention illustrated in FIG. 1. Thus, for these three signals, respective sampling rate converters 90, 92 and 94 are shown. The outputs of the sampling rate converters 90, 92, and 94 are received, along with the signal generated by the voice annotation circuit 86, by a digital selector 96. In one embodiment, the digital selector is implemented in the form of a conventional signal multiplexer and, in another embodiment, is implemented as a conventional time-division mixer to multiplex samples from these inputs to an output port of the digital selector 96. By configuring each of the sampling rate converters 90, 92, and 94 to convert the respective inputs to an output signal having a sampling rate of 22 KHz, a single digital-analog-converter (DAC) 98 can be used to produce an analog output signal for presentation to the external world (e.g. headphones or speakers). This type of system is advantageous in that it requires no individual DACs for each signal source, but only one for the digitally mixed signal. This is in contrast to a conventional approach in which a DAC is used for each source and with each operating at a sampling rate equal to that of the input signal. The illustrated system application avoids this additional analog circuitry, which is burdensome in terms of size and tolerance especially when implementing as part of or with integrated circuits.

According to a particular embodiment, a sampling rate converter for an initial R estimate, or nominal ratio, of 5/2, includes the following parameters: the FIFO size is 3; the initial gain provided by gain circuit 56 is set at 3/8; the interval between gain updates provided by the counter 58 is 128 samples; the gain of the scaler 44 is 1/1024; and the limit values provided by emitters 62 and 64 are as previously indicated for a final gain of the loop at 1/4096, and the final gain of the LPF 40 at 1/512.

The arithmetic circuits, and functional blocks, are implemented using any number of different types of circuits, including, e.g., an appropriately programmed processor discrete hardware, application-specific integrated circuitry, or combinations of these circuit types.

Accordingly, the present invention provides, among other aspects, a sampling rate conversion system and method for controlling the data throughput of an output buffer based on an estimate of the ratio between the input and output sampling rates. Other aspects and embodiments of the present invention will be apparent to those skilled in the art from consideration of the specification and practice of the invention disclosed herein. It is intended that the specification and illustrated embodiments be considered as exemplary only, with a true scope and spirit of the invention being indicated by the following claims.

What is claimed is:

1. In a system for converting an input signal retrieved at a first rate according to a first clock signal to an output signal generated at a second rate according to a second clock signal, a data sampling conversion arrangement comprising:

an output buffer circuit having a set of data storage registers arranged to pass, as outputs, computed data samples received at a variable rate;

a current capacity signal generated by the output buffer circuit and indicative of current use of the set of data storage registers;

a ratio estimation circuit arranged to provide an estimate of the actual ratio between the first rate and the second rate in response to the current capacity signal; and a control circuit responsive to at least one of the first and second clock signals and to the ratio estimation circuit and arranged to control the variable rate at which the data storage registers receive the computed data samples to inhibit the set of data storage registers from being over-utilized or under-utilized.

2. A data sampling conversion arrangement, according to claim 1, wherein the control circuit includes an accumulator.

3. A data sampling conversion arrangement, according to claim 1, wherein the set of data storage registers is arranged to provide first-in-first-out access to the computed data samples.

4. A data sampling conversion arrangement, according to claim 1, wherein the current capacity signal from the output buffer circuit indicates a quantity of the data storage registers that currently store data samples.

5. A data sampling conversion arrangement, according to claim 1, wherein the current capacity signal from the output buffer circuit indicates a quantity of the data storage registers that do not currently store data samples.

6. A data sampling conversion arrangement, according to claim 1, wherein the ratio estimation circuit provides a ratio signal.

7. A data sampling conversion arrangement, according to claim 6, wherein the ratio estimation circuit integrates error samples.

8. A data sampling conversion arrangement, according to claim 6, wherein the ratio estimation circuit provides the ratio signal as a function of the current capacity signal and the second rate.

9. A data sampling conversion arrangement, according to claim 1, wherein the control circuit includes an accumulator arranged to accumulate a value corresponding to the estimate of the ratio of sampling rates.

10. A data sampling conversion arrangement, according to claim 9, wherein the control circuit includes a detection circuit arranged to respond to the accumulator reaching a integer part of zero by indicating that the buffer circuit is to receive one of the computed data samples.

11. A data sampling conversion arrangement, according to claim 1, wherein the output buffer circuit includes a first-in-first-out memory circuit having no more than four registers used during normal operation.

12. A digital signal processing system for processing an input signal received at a first rate and converting the input signal to an output signal generated at a second rate, the system comprising:
a first-in-first-out output buffer circuit having a set of data storage registers arranged to receive computed data samples for storage at a controlled rate and to pass the received computed data samples at a second rate;
a current capacity signal generated by the output buffer circuit and indicative of current use of the data storage registers;
a frequency ratio estimation circuit arranged to respond to the current capacity signal by providing an estimate of the actual ratio between the first rate and the second rate;
a control circuit, responsive to the frequency ratio estimation circuit, for generating the controlled rate at which the computed data samples are to be passed to the output buffer circuit; and
a digital processing circuit constructed and arranged to receive the data samples at a first rate and pass them to the output buffer circuit at the controlled rate and to output corresponding processed data samples at the second rate.

13. A digital signal processing system, according to claim 12, wherein the frequency ratio estimation circuit responds to both the current capacity signal and to a clock signal corresponding to the second rate.

14. A digital signal processing system, according to claim 12, wherein the control circuit includes an accumulator circuit and a threshold subtractor circuit.

15. A digital signal processing system, according to claim 14, wherein the digital processing circuit includes a digital filter.

16. A digital signal processing system, according to claim 15, wherein the digital filter is a decimation filter.

17. A digital signal processing system, according to claim 15, wherein the digital filter is a finite impulse response filter.

18. A digital signal processing system, according to claim 15, wherein the digital filter is a finite impulse response lowpass filter.

19. A method for converting an input signal received at a first rate to an output signal generated at a second lower rate, comprising:
using a set of data storage registers as an output buffer for receiving computed data samples for storage at a controlled rate and for passing the data samples as outputs at a second rate;
providing a quantity signal to indicate the quantity of the data samples that are currently stored in the set of data storage registers;
estimating the actual ratio between the first rate and the second rate in response to the quantity signal; and
in response to estimating the actual ratio, generating the controlled rate at which the data samples are to be passed to the set of data registers and outputting the data samples to the output at the second rate.

20. A method, according to claim 19, wherein estimating the actual ratio between the first rate and the second rate includes monitoring the second rate and the quantity of the data samples that are stored in the output buffer.

21. A communications system, comprising:
a signal generator providing a input signal at an output port of the signal generator;
a data sampling conversion arrangement including
an output buffer having a set of data storage registers arranged to pass processed data samples at a variable rate, the data samples being produced from input samples received at a first rate according to a first clock signal,
a current capacity signal generated by the output buffer circuit and indicative of current use of the set of data storage registers,
a data clocking circuit arranged to generate a second clock signal,
a ratio estimator arranged to provide an estimate of the actual ratio between the first rate and a second rate defined in synchronism with the second clock signal in response to the current capacity signal,
a controller responsive to at least one of the first and second clock signals and to the ratio estimation circuit and arranged to control a variable rate at which the data storage registers receive the processed data samples; and
a signal conditioner configured and arranged to respond to the data samples received at the first rate and to pass them to the data storage registers and to provide an output signal in response thereto having a second rate defined in synchronism with the second clock signal.

22. A communication system, according to claim 21, wherein the signal conditioner includes a filter.

23. A communication system, according to claim 21, wherein the signal generator generates the input signal as representing audio data.

24. A communication system, according to claim 21, wherein the first rate is greater than the second rate.

25. A communication system, according to claim 21, wherein the audio data is generated at the output port of the signal generator in analog form.

26. A communication system, according to claim 21, wherein the set of data storage registers is arranged to provide first-in-first-out access to the received data samples.

27. A communication system, according to claim 21, wherein the ratio estimator provides the ratio signal as a function of the current capacity signal and the second rate.

28. A communication system, according to claim 21, wherein the controller circuit includes an accumulator arranged to accumulate the value corresponding to the estimate of the ratio of sampling rates and a zero-value detector, and means to decrement the integer part by one in response to the first clock, and means to output a fractional part.

29. A data sampling conversion arrangement, according to claim 10, wherein the detection circuit provides a fractional output for use by a conditioning circuit for computing the computed data samples.

30. A communication system, according to claim 28, wherein the signal conditioner uses the fractional part for processing the data samples.

* * * * *

UNITED STATES PATENT AND TRADEMARK OFFICE
CERTIFICATE OF CORRECTION

PATENT NO. : 6,005,901

DATED : December 21, 1999

INVENTOR(S) : Alfredo R. Linz

It is certified that error appears in the above-identified patent and that said Letters Patent is hereby corrected as shown below:

Column 5, line 7, delete "impulses" and insert therefor -- impulse --.

Column 8, line 32, delete "output:" and insert therefor -- output --.

Signed and Sealed this

Tenth Day of April, 2001

Attest:

NICHOLAS P. GODICI

Attesting Officer    Acting Director of the United States Patent and Trademark Office